United States Patent [19]

Sonoda et al.

[11] Patent Number: 4,967,242
[45] Date of Patent: Oct. 30, 1990

[54] HETEROJUNCTION FIELD EFFECT TRANSISTOR

[75] Inventors: Takuji Sonoda; Kazuo Hayashi, both of Itami, Japan

[73] Assignee: Mitsubishi Denki Kabushiki Kaisha, Tokyo, Japan

[21] Appl. No.: 300,262

[22] Filed: Jan. 19, 1989

[30] Foreign Application Priority Data

Jan. 21, 1988 [JP] Japan .................................. 63-12251

[51] Int. Cl.[5] .................... H01L 29/205; H01L 29/80
[52] U.S. Cl. .......................................... 357/22; 357/16
[58] Field of Search ................................. 357/22, 16, 4

[56] References Cited

U.S. PATENT DOCUMENTS

| | | | |
|---|---|---|---|
| 4,792,832 | 12/1988 | Baba | 357/4 |
| 4,806,998 | 2/1989 | Vinter | 357/22 |
| 4,827,320 | 5/1989 | Morkoc et al. | 357/22 |

FOREIGN PATENT DOCUMENTS

| | | | |
|---|---|---|---|
| 2600821 | 12/1987 | France | 357/16 |
| 60-263475 | 12/1985 | Japan | 357/22 |
| 63-90173 | 4/1988 | Japan | 357/22 |
| 63-250863 | 10/1988 | Japan | 357/22 |

OTHER PUBLICATIONS

"Optimised HEMT Structure with an $Al_{0.45}Ga_{0.55}As$ Spacer and an $Al_{0.20}Ga_{0.80}As$ Doped Region", Huang et al., Electronics Letters, vol. 21, No. 20, Sep. 1985, pp. 925-926.

"Persistant Photoconductivity in AlGaAs/GaAs Modulation Doped Layers and Field Effect Transistors: A Review", Nathan, Solid-State Electronics, vol. 29, No. 2, pp. 167-172, 1986.

"Power and Noise Performance of the Pseudomorphic Modulation Doped Field Effect Transistor at 60 GHz", Henderson et al., International Electron Devices Meeting, Dec. 7-10, 1986, IEDM Technical Digest, pp. 464-466.

"Elimination of Drain I/V Collapse in MODFETs Through the Use of Thin n-GaAs/AlGaAs Superlattice", Fischer et al., Electronics Letters, vol. 20, No. 13, 1984, pp. 743-744.

"AlAs/n-GaAs Superlattice and Its Application to High-Quality Two-Dimensional Electron Gas Systems", Baba et al., J. Appl. Phys. 59(2), 01/15/86, pp. 526-532.

"Electron Mobilities in Modulation Doped $Ga_{0.47}In_{0.53}As/Al_{0.48}In_{0.52}As$ Heterojunctions Grown by Molecular Beam Epitaxy", Cheng et al., Appl. Phys. Lett. 40(2), Jan. 15, 1982, pp. 147-149.

Primary Examiner—Jerome Jackson, Jr.
Attorney, Agent, or Firm—Leydig, Voit & Mayer

[57] ABSTRACT

A heterojunction field effect transistor includes a carrier supplying layer comprising material which is not likely to produce a deep level even by doping. A channel layer comprises material which has the largest electron affinity among three types of semiconductor material constituting the heterojunction FET and has a high carrier mobility. A spacer layer is interposed between the channel layer and the carrier supplying layer and comprises material which enables the reduction of Coulomb interaction between two-dimensional carriers in the channel layer and ions in the carrier supplying layer. In addition, the spacer layer increases the effective conduction band energy discontinuity $\Delta E_c$ between the carrier supplying layer and the channel layer.

3 Claims, 1 Drawing Sheet

HETEROJUNCTION FIELD EFFECT TRANSISTOR

FIELD OF THE INVENTION

This invention relates to a heterojunction field effect transistor, and more particularly to a field effect transistor having enhanced high speed properties.

BACKGROUND OF THE INVENTION

Heterojunction field effect transistors are known in the prior art, and high speed devices have two semiconductors of different band gaps arranged to produce a two-dimensional electron gas at the heterojunction interface. The electron gas enhances the operating speed of the device, and is produced by doping impurities into one of the two semiconductors forming the heterojunction which has the larger band gap, making that layer of n-type material.

An example of such a prior art heterojunction field effect transistor is illustrated in FIG. 3. In that figure, a channel layer 12 is formed of GaAs, and an electron supplying layer comprising n-type $Al_xGa_{1-x}As$ 11 is produced on the GaAs substrate. The heterojunction thus formed produces a two-dimensional electron gas 4 at the boundary between the channel layer 12 and the electron supplying layer 11. A source electrode 5, a gate electrode 6, and a drain electrode 7 are produced at the appropriate positions on the electron supplying layer 11, with appropriate connections formed to the electrodes for connection into a circuit.

FIG. 4 shows an energy band structure of the heterojunction field effect transistor of FIG. 3. It is seen that the n-type $Al_xGa_{1-x}As$/GaAs heterojunction has a relatively large band gap $\Delta E_c$ which is desired in such a device in order for the electrons from the donor material in the layer 11 to produce an electron gas just below the Fermi level of the channel layer 12. If the energy band gap $\Delta E_c$ is too small, the two-dimensional electons will return to the conduction band of the donor or source material. Therefore, a larger band gap keeps the electrons in the two-dimensional electron gas where they can serve as carriers in the channel.

For the foregoing reasons, it has been conventional to use doped $Al_xGa_{1-x}As$ for the donor level and GaAs for the underlying undoped semiconductor layer, because the AlGaAs has a larger band gap than the GaAs. In such a structure, the n-type AlGaAs layer 11 functions as the electron supplying layer and the undoped GaAs layer functions as the channel layer.

In order to enhance the high frequency performance of a heterojunction field effect transistor in the same element size, it is worthwhile to reduce the gate to source parasitic resistance $R_s$. The gate to source parasitic resistance $R_s$ of a heterojunction field transistor is represented by the sum of the source contact resistance $R_{co}$ and the gate to source channel resistance $R_{sg}$.

$$R_s = R_{co} + R_{sg} \quad (1)$$

Since the source contact resistance $R_{co}$ is relatively small as compared to the gate to source channel resistance $R_{sg}$, the contact resistance $R_{co}$ can be ignored and in order to reduce $R_s$, attention is directed to reducing $R_{sg}$. The gate to source channel resistance $R_{sg}$ is represented by the following expression:

$$R_{sg} = \frac{L_{sg}}{n_s \cdot q \cdot \mu \cdot w_{gt}} \quad (\Omega) \quad (2)$$

where $n_s$ represents the two-dimensional electron concentration, $\mu$ represents the electron mobility, $w_{gt}$ represents the gate width, $L_{sg}$ represents the gate to source spacing, and q represents the elementary electrical charge.

It is therefore seen that in order to reduce $R_{sg}$ for a structure of a given size (i.e., $L_{sg}/W_{gt}$ is constant) it is necessary to increase the two-dimensional electron concentration $n_s$ and/or the mobility $\mu$. The two-dimensional electron concentration $n_s$ in the prior art device is approximately represented by the following expression:

$$n_s \propto (2\epsilon N \, \Delta E_c / q)^{\frac{1}{2}} \quad (3)$$

where $\Delta E_c$ represents the conduction band energy discontinuity between the n-type $Al_xGa_{1-x}As$ and the GaAs, N represents carrier concentration of the n-type AlGaAs and $\epsilon$ represents the permittivity of the n-type $Al_xGa_{1-x}As$. Thus, it will be appreciated that in order to increase the two-dimensional electron concentration $n_s$, it is necessary to increase the carrier concentration N or the conduction band energy discontinuity $\Delta E_c$ or both.

Focusing now on the mobility $\mu$ of the two-dimensional electron gas, such mobility is approximately represented by the following expression:

$$\frac{1}{\mu} = \frac{1}{\mu_L} + \frac{1}{\mu_i} \quad (4)$$

where $\mu_L$ is determined by the lattice vibration of the channel material in which the two-dimensional electron gas is produced, and generally increases with the decrease of the effective mass of the material at a constant temperature. The factor $\mu_i$ represents the mobility due to ionized impurity scattering, and this factor increases with the decrease in impurity concentration and with the decrease in Coulomb interaction at a constant temperature. Thus, $\mu_i$ is determined by the ion concentration in the non-doped GaAs and the Coulomb interaction between the two-dimensional electron gas and the ions in the n-type $Al_xGa_{1-x}As$.

In attempting to reduce the gate to source channel resistance by increasing the carrier concentration of the AlGaAs layer in the prior art structure described above, at least two major problems arise. First of all, Si doped into the AlGaAs layer also acts as the so-called DX centers as well as shallow donors. The shallow donors can supply electrons into the interface of the GaAs/AlGaAs, however, the DX centers cannot because the DX centers are located farther from the conduction band. Therefore the carrier concentration in the AlGaAs layer cannot increase proportionately with the Si doping level. Secondly, the conduction band discontinuity $\Delta E_c$ increases with the increase in the Al composition proportion x of the $Al_xGa_{1-x}As$. When the x increases, however, the proportion of donors which function as DX centers and the activation energy of the donors also increase, and the carrier concentration N is reduced at the same doping level. Thus, it is not possible to increase only the $\Delta E_c$ independently, and at some value of conduction band discontinuity $\Delta E_c$ the product of carrier concentration N and conduction band discontinuity $\Delta E_c$ reaches the maximum at the same doping level. Usually, the maximum $\Delta E_c$ is about 0.3 eV. When $\Delta E_c$ is about 0.3 eV, the maximum value of the shallow donors doped into the $Al_xGa_{1-x}As$ layer is about $1\times10^{18}$ cm$^{-3}$, and then the maximum two-dimensional electron concentration $n_s$ determined from the expression 3 is about $2\times10^{12}$ cm$^{-2}$.

For the foregoing reasons, in dealing with the prior art heterojunction field effect transistor it was not possible to further reduce the parasitic resistance and therefore increase the high frequency performance.

SUMMARY OF THE INVENTION

In view of the foregoing, it is a general aim of the present invention to further enhance the high frequency performance of a heterojunction field effect transistor.

In accomplishing that aim, it is an object of the present invention to minimize the source to drain resistance of a field effect transistor while enhancing the concentration and mobility of carriers in the channel.

In accordance with the invention, there is provided a heterojunction field effect transistor having a channel layer, a carrier supplying layer, and an intermediate spacer layer interposed between the channel and carrier supplying layers. The carrier supplying layer has a charge carrier density which is greater than that which is available in the AlGaAs of the prior art. In addition, the donors of the carrier supplying layer have a minimum deep level density, providing a majority of shallow donors for creating a two-dimensional electron gas. The channel, among the three layers constituting the heterojunction FET, has the largest electron affinity. In addition, the channel layer has a carrier mobility which is in excess of that available in the prior art. The spacer layer which is interposed between the carrier supplying layer and the channel layer comprises means for reducing Coulomb interaction between the two-dimensional carriers in the channel layer and ions in the carrier supplying layer. In addition, the spacer layer comprises a material which increases the effective conduction band discontinuity $\Delta E_c$ between the carrier supplying layer and the channel layer. The result is improved high speed operation by virtue of lower source to gate resistance.

In the preferred practice of the invention, the channel layer comprises InGaAs, the carrier supplying layer comprises n-doped GaAs and the spacer layer comprises a graded AlGaAs layer which reduces Coulomb interaction and raises the effective band gap discontinuity between the channel which carries the electrons and the carrier supplying layer which contains the positive ions which had contributed to the electrons to the channel layer.

Other objects and advantages of the present invention will become apparent from the following detailed description.

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
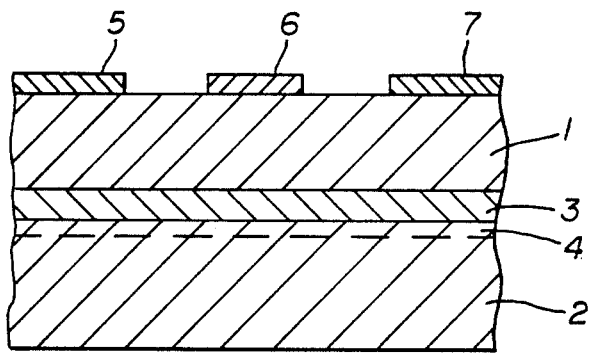
FIG. 1 is a diagram showing a heterojunction field effect transistor exemplifying the present invention.

Turning now to FIG. 1, there is shown a field effect transistor exemplifying the present invention. The field effect transistor is formed on an epitaxial structure consisting n-type GaAs, non-doped graded $Al_xGa_{1-x}As$ and non-doped $In_yGa_{1-y}As$ layers successively grown on a semi-insulating substrate. The non-doped $In_yGa_{1-y}As$ layer 2 acts as a channel layer. The two-dimensional electron gas 4 is created in non-doped $In_yGa_{1-y}As$ layer 2 at the boundary between the non-doped $In_yGa_{1-y}As$ layer 2 and the spacer layer 3 and provides conduction through the device. A carrier supplying layer 1, in the preferred embodiment n-type GaAs, supplies carriers, in the present embodiment electrons, of relatively high concentration and having a minimum of DX or deep level donors. Although the GaAs carrier supplying layer can have a high concentration of carriers and a minimum deep density, the band gap discontinuity of GaAs with respect to InGaAs is not thought to be high enough to make such device attractive. In practicing the invention, a further layer 3 is provided intermediate the channel layer 2 and carrier supplying layer 1 for reducing Coulomb interaction between the carriers and ions, and enhancing the band gap discontinuity between the GaAs and the InGaAs. In order to minimize potential barriers, the spacer layer 3 has a graded type band gap with the aluminum concentration at zero percent adjacent the GaAs carrier supplying layer and rising to its maximum at the junction with the channel layer.

Figure 2:
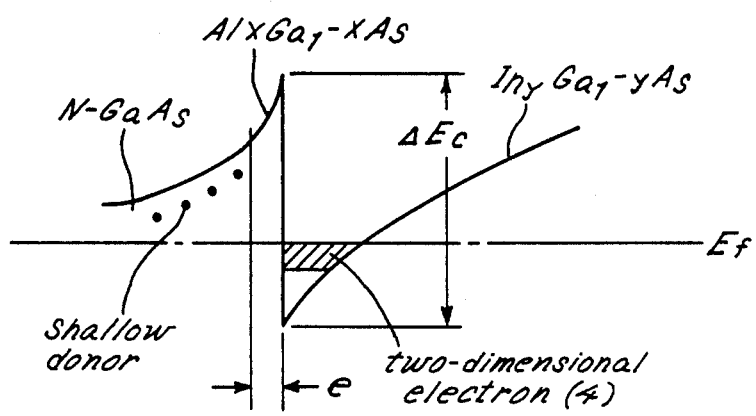
FIG. 2 is a diagram showing an energy band gap structure of the heterojunction field effect transistor of FIG. 1.

By virtue of the heterojunction, and as illustrated in FIGS. 1 and 2, there are two-dimensional electrons 4 generated at the boundary between the channel layer 2 and the spacer layer 3. A source electrode, a gate electrode 6, and a drain electrode 7 are produced at required positions on the electron supplying layer 1.

Figure 3:
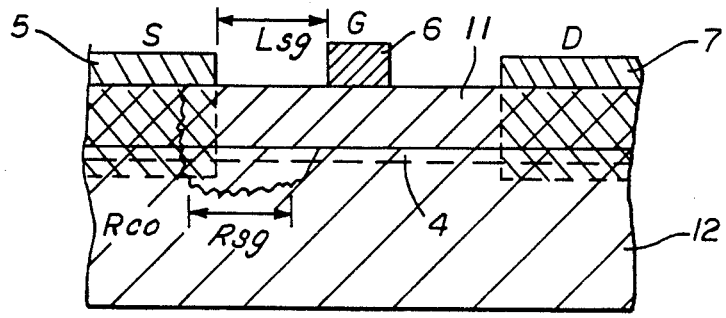
FIG. 3 is a diagram showing a prior art heterojunction field effect transistor.
Figure 4:
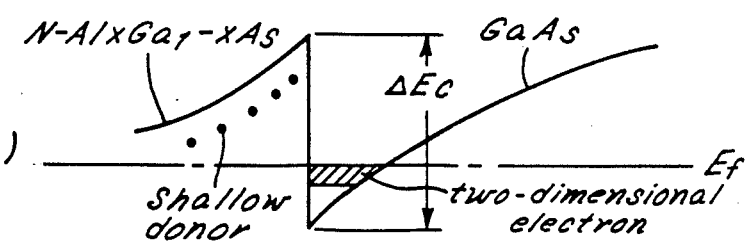
FIG. 4 is a diagram showing an energy band gap structure of the heterojunction field effect transistor of FIG. 3.

N-type GaAs is employed for the electron supplying layer in this embodiment, as a material which enables a significant increase in carrier concentration without producing deep levels. The maximum carrier concentration of this n-type GaAs layer is as large as $5\times10^{18}$ cm$^{-3}$ in contrast to that of n-type AlGaAs being $1\times10^{18}$ cm$^{-3}$, as described in connection with FIG. 3. Furthermore, non-doped $In_yGa_{1-y}As$ which produces a conduction band discontinuity with the n-type GaAs electron supplying layer is employed for the channel layer. In this non-doped layer comprising $In_yGa_{1-y}As$, it is possible to increase the carrier mobility by about 20% over the prior art channel layer comprising GaAs. Furthermore, in this embodiment, a non-doped $Al_xGa_{1-x}As$ spacer layer 3 having a graded type band gap is provided between the electron supplying layer 1 and the channel layer 2 in order to reduce the Coulomb interaction between the two-dimensional electrons in the channel and the ions in the electron supplying layer. In addition, the spacer layer, which is of a different material than either the carrier supplying layer or the channel layer, serves to increase the effective $\Delta E_c$ between the channel layer and the electron supplying layer. The composition proportion x of this layer 3 is set at the maximum at the junction with the $In_yGa_{1-y}As$ channel layer 2, and is set to 0 at the junction surface with the GaAs electron supplying layer 1, thereby resulting in an inclined or graded type energy band gap. By providing this spacer layer 3, the conduction band discontinuity $\Delta E_c$ between the electron supplying layer 1 and the channel layer 2 can be increased to about 0.5 eV in contrast to that between $Al_xGa_{1-x}As$ and GaAs which is about 0.3 eV.

The two-dimensional electron concentration $n_s$ in the heterojunction field effect transistor structure of this embodiment is represented by the following expression:

$$n_s \approx \left( \sqrt{N1^2 + \frac{2N\epsilon_1 \Delta E_c}{q}} - \frac{\epsilon_1}{\epsilon_2} N1 \right) \quad (5)$$

where N represents the carrier concentration of the GaAs carrier supply layer, 1 the thickness of the non-doped $Al_xGa_{1-x}As$ spacer layer, $\epsilon_1$ and $\epsilon_2$ permittivity of GaAs and $Al_xGa_{1-x}As$, respectively, and q the quantity of electric charge.

When $N=3\times 10^{18}$ cm$^{-3}$, $\Delta E_c=0.35$ eV, and $\epsilon_1/\epsilon_2 \approx 1.03$, $n_s$ becomes nearly equal to $2.9\times 10^{12}$ cm$^{-2}$, producing a one and a half times increase of $n_s$ over the prior art device.

The values of $n_s$ and $\mu$ which are obtained from the above-described calculation for producing the n type GaAs/$Al_xGa_{1-x}As$/$In_yGa_{1-y}As$ heterojunction are $n_s=2.8\times 10^{12}$ cm$^{-2}$ and $\mu=8000$ cm$^2$v$^{-1}$sec$^{-1}$. These reduce the $R_{sg}$ to about ½ as compared to the usual n type $Al_xGa_{1-x}As$/GaAs heterojunction element which have values of $n_s=2\times 10^{12}$ cm$^{-2}$ and $\mu=6000$ cm$^2$v$^{-1}$sec$^{-1}$ as is apparent from the formula (2). When the heterojunction field effect transistor of this embodiment is used for the device of the same structure, that is, having the same gate length, same electrode spacing, and same gate width as a device having noise figure of 1.0 dB at 12 GHz in the usual n type $Al_xGa_{1-x}As$/GaAs heterojunction element, the noise figure thereof becomes 0.85 dB, showing a noise reduction of 0.15 dB.

In the heterojunction field effect transistor of this embodiment, n type GaAs which is not likely to produce deep levels (DX centers) even by high doping is used for the electron supplying layer. Non-doped $In_yGa_{1-y}As$ is used for the channel layer thereby to enable increasing the two-dimensional carrier mobility. The spacer layer comprising non-doped $Al_xGa_{1-x}As$ enables the reduction of Coulomb interaction between the two-dimensional electrons in the channel layer and ions in the electron supplying layer. In addition, the spacer layer also increases the effective conduction band discontinuity $\Delta E_c$ between the electron supplying layer and the channel layer. Accordingly, it is possible to increase the effective $\Delta E_c$ and thereby to increase the two-dimensional electron concentration. Thus the parasitic resistance is further reduced and the noise figure of the device is reduced to a great extent.

In the above-illustrated embodiment, N-type GaAs/$Al_xGa_{1-x}As$/$In_yGa_{1-y}As$ are used as three different materials constituting a heterojunction field effect transistor, but other combinations such as N-type InP/$Al_xIn_{1-x}As$/$Ga_yIn_{1-y}As$, N-type $In_xGa_{1-x}As$/non-doped $Al_zGa_{1-z}As$/non-doped InGaAs, N-type $In_xGa_{1-y}Al_yAs$/$In_xGa_{1-y2}Al_{y2}As$/InGaAs ($y_2>y_1$), N-type GaAs/ZnSe/InGaAs, or N-type GaAs/ZnS/InGaAs can be used with similar effects as those described above.

As is evident from the foregoing description, according to the present invention, a heterojunction field effect transistor is constituted by an electron supplying layer comprising material which is not likely to produce a deep level even by doping and a channel layer comprising material which enables the increase of the conduction band energy discontinuity $\Delta E_c$ between itself and the electron supplying layer. The channel layer is configured to have a high mobility, and there is provided a spacer layer interposed between the channel layer and the electron supplying layer comprising material which enables the reduction of Coulomb interaction between the two-dimensional electrons in the channel layer and ions in the electron supplying layer, as well as increasing the effective $\Delta E_c$ between the electron supplying layer and the channel layer. Accordingly, the parasitic resistance is further reduced and the noise figure of the device can be reduced to a great extent.

What is claimed is:

1. A heterojunction field effect transistor comprising:
    a channel layer and a carrier supplying layer separated by a spacer layer;
    the carrier supplying layer having a charge carrier density with a minimum deep level density for creating a two-dimensional electron gas in the channel layer;
    the channel layer having the largest electron affinity among the three layers constituting the heterojunction FET; and
    the spacer layer interposed between the carrier supplying layer and the channel layer and comprising means for reducing Coulomb interaction between two-dimensional carriers in the channel layer and ions in the carrier supplying layer, the spacer layer comprising a material which increases the effective conduction band discontinuity $\Delta E_c$ between the carrier supplying layer and the channel layer, the spacer layer having a graded band gap from substantially zero percent aluminum concentration at the junction with the carrier supplying layer to the maximum proportion x of aluminum concentration at the junction with the channel layer.

2. A heterojunction field effect transistor comprising:
    a channel layer and a carrier supplying layer separated by a spacer layer;
    the carrier supplying layer having a charge carrier density with a minimum deep level density for creating a two-dimensional electron gas in the channel layer;
    the channel layer having the largest electron affinity among the three layers constituting the heterojunction FET;
    the spacer layer interposed between the carrier supplying layer and the channel layer and comprising means for reducing Coulomb interaction between two-dimensional carriers in the channel layer and ions in the carrier supplying layer, the spacer layer comprising a material which increases the effective conduction band discontinuity $\Delta E_c$ between the carrier supplying layer and the channel layer;
    the channel layer comprising non-doped $In_yGa_{1-y}As$, the spacer layer comprising non-doped $Al_xGa_{1-x}As$ and the carrier supplying layer comprising n-type GaAs; and
    the spacer layer having a graded band gap from substantially zero percent aluminum concentration at the junction with the carrier supplying layer to the maximum proportion x of aluminum concentration at the junction with the channel layer.

3. A heterojunction field effect transistor comprising:

an $In_yGa_{1-y}As$ channel layer and a GaAs carrier supplying layer separated by a spacer layer of $Al_xGa_{1-x}As$;

the GaAs carrier supplying layer having a charge carrier density with a minimum deep level density for creating a two-dimensional electron gas in the channel layer;

the $In_yGa_{1-y}As$ channel layer having the largest electron affinity among the three layers; and the $Al_xGa_{1-x}As$ spacer layer being interposed between the carrier layer and the channel layer and having a thickness sufficient for reducing Coulomb interaction between two-dimensional carriers in the channel layer and ions in the carrier supplying layer, the $Al_xGa_{1-x}As$ spacer layer comprising a material which increases the effective conduction band discontinuity $\Delta E_C$ between the carrier supplying layer and the channel layer, the spacer layer having a graded band gap from substantially zero percent aluminum concentration at the junction with the carrier supplying layer to the maximum percentage x of aluminum concentration at the junction with the channel layer.

* * * * *